United States Patent [19]
Braitberg

[11] 4,159,489
[45] Jun. 26, 1979

[54] MAGNETIC RECORD REPRODUCING SYSTEM

[75] Inventor: Michael F. Braitberg, Larkspur, Colo.

[73] Assignee: Honeywell Inc., Minneapolis, Minn.

[21] Appl. No.: 728,168

[22] Filed: Sep. 30, 1976

[51] Int. Cl.$^2$ ............................................. G11B 5/45
[52] U.S. Cl. ........................................................ 360/65
[58] Field of Search ...................................... 360/65, 67

[56] References Cited

U.S. PATENT DOCUMENTS

| | | | |
|---|---|---|---|
| 2,861,258 | 11/1958 | Walsh et al. | 360/67 |
| 3,026,380 | 3/1962 | Reher et al. | 360/67 |
| 3,160,824 | 12/1964 | Stair | 360/67 |
| 3,316,360 | 4/1967 | Coleman, Jr. et al. | 360/65 |
| 3,513,267 | 5/1970 | Trost | 360/67 |
| 3,585,315 | 6/1971 | Shaifer | 360/67 |
| 3,781,488 | 12/1973 | Byers | 360/65 |
| 3,927,420 | 12/1975 | Hayashi et al. | 360/65 |

*Primary Examiner*—Vincent P. Canney
*Attorney, Agent, or Firm*—Laurence J. Marhoefer; Lockwood Burton

[57] ABSTRACT

A magnetic record reproducing system preamplifier includes an inductive choke in the emitter circuit of a first stage transistor amplifier whereby to provide a frequency responsive variable input impedance whereby to maintain a proper impedance relationship between the inductive transducer and the input impedance of the first stage amplifier. A second stage transistor amplifier is connected to the output of the first stage amplifier in cascode relationship, reducing the effective voltage gain of the first stage to substantially zero. The choke in the input circuit of the first stage amplifier acts as a degenerative feedback at higher frequencies, effectively reducing the bias current through the first stage transistor. The base emitter capacitance of the first stage transistor tends to resonate with the inductance of the transducer. The effective degenerative feedback at that first stage transistor tends to push that resonant frequency beyond the desired or useful frequency band of the system.

12 Claims, 3 Drawing Figures

MAGNETIC RECORD REPRODUCING SYSTEM

BACKGROUND OF THE INVENTION

1. Field of the Invention

The present invention relates to magnetic record apparatus, and more particularly to preamplifier means for a magnetic reproducing, or playback, head.

2. Description of the Prior Art

It is, of course, the objective of any record playback system to faithfully reproduce the signals which were impressed on the recording medium, free from distortions and superimposed spurious signals known as noise. In the art of magnetic recording, it has been found that much of the noise experienced in the reproduction of the recorded signals was due, in part, to the magnetic coating on the tape, and, in part, to the efficiency of the reproduce head. Those problems have been challenged and the technology has now advanced to the point where the limiting factor in the signal to noise ratio of the reproduced signal is in the electronic amplification system. Heretofore, because of the peculiarities of transistor circuitry, efforts to improve the signal to noise ratio on wide band (up to 2 MHz) systems have encountered problems.

Efforts to overcome the noise factor in the lower frequency range have usually required that the input stage of a preamplifier be operated at a relatively high current. The input impedance in the transistor amplifier is a function of the internal resistance of the transistor as is the internal noise generator ($E_n$) thereof and that internal resistance is inversely proportional to the current.

When a low internal resistance and low internal noise generator ($E_n$) is required, such as when the magnetic transducer has a low impedance and, therefore, an intrinsically low thermal noise contribution, a conflict arises at the higher frequency range. At the higher frequency range, the reproduce head, or transducer, being an inductive device, exhibits a much higher impedance. The lower input impedance of the amplifier tends to load the transducer at the higher frequencies. Further, the high current in the input stage also tends to maximize the base emitter capacitance of the transistor; that will tend to lower the resonant frequency of the transducer to within the desired 2 MHz pass band, cause problems in amplitude and phase equalization and, further, cause the noise match of the preamplifier to the transducer to be non-optimum due to a component of noise caused by the noise current of the input stage of the amplifier flowing through the impedance of the transducer ($I_nZ$), the transducer impedance being maximized by the high input capacitance. Known efforts to overcome such undesirable effects by using degenerative feedback tend to increase the noise level for the lower frequency range by increasing the internal resistance of the transistor or cause instability at the higher frequency range due to the high Q of the transducer.

SUMMARY OF THE INVENTION

It is, accordingly, an object of the present invention to provide an improved preamplifier for magnetic transducer systems which avoids the foregoing deficiencies.

It is another object of the present invention to provide an improved preamplifier as set forth which features improved signal to noise characteristics over a wide frequency range of input signals.

It is a further object of the present invention to provide an improved preamplifier as set forth which is characterized in simplicity of structure and operation.

In accomplishing these and other objects, there has been provided, in accordance with the present invention, a preamplifier for a magnetic record reproducing transducer which includes a cascode connected transistor pair as an input stage. A frequency sensitive impedance member is included in the emitter circuit of the input stage to provide a degenerative feedback that increases with the frequency of the applied signals above a predetermined threshold frequency.

BRIEF DESCRIPTION OF THE DRAWINGS

A better understanding of the present invention may be had from the following detailed description when read in the light of the accompanying drawings, in which.

DETAILED DESCRIPTION

Figure 1:
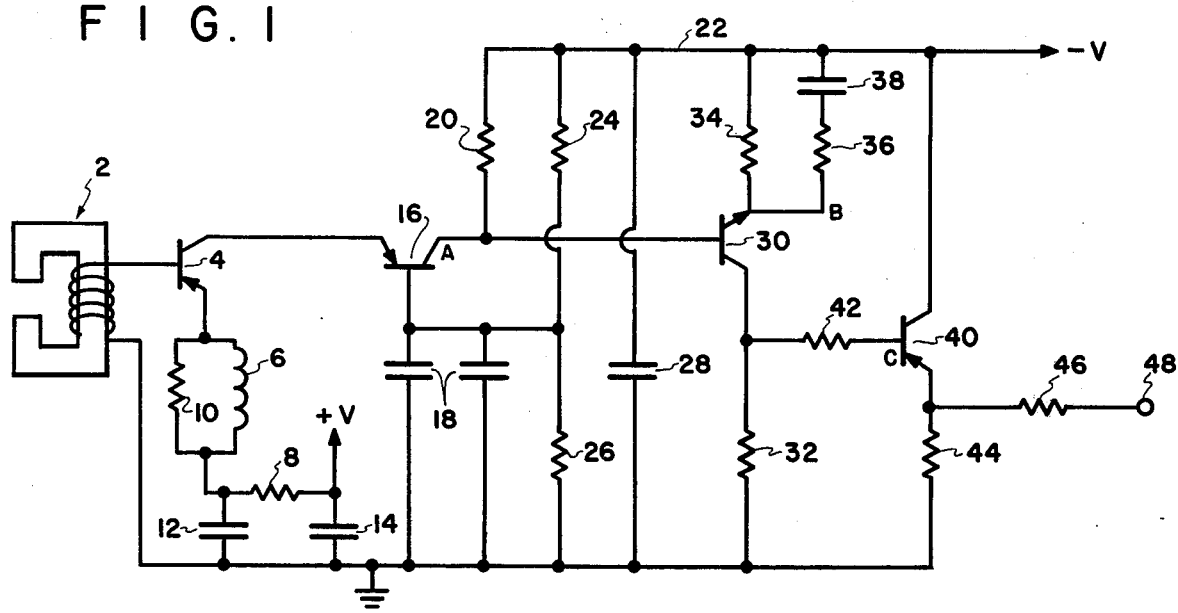
FIG. 1 is a schematic diagram of a circuit embodying the present invention.

Referring now to the drawings in more detail, there is shown, in FIG. 1, a magnetic record reproducing head or transducer 2. One terminal of the transducer winding is connected to ground while the other terminal of the transducer winding is connected to the base terminal of an input transistor 4, which is, in turn, connected essentially in a common emitter mode at low frequency. The emitter of the transistor 4 is connected through an inductance, or choke 6 and a resistor 8 to a positive voltage supply. Connected in shunt with the choke 6 is a small damping resistor 10. A first filter capacitor 12 is connected between the lower end of the choke 6 and ground. A second filter capacitor 14 is connected between the end of the resistor 8 and ground.

The collector of the transistor 4 is connected in cascode relationship to the emitter of a transistor 16. The base of the transistor 16 is connected, through a pair of filter capacitors 18, to ground. The collector of the transistor 16 is connected through a load resistor 20 to a negative power supply bus 22. A pair of resistors 24 and 26 are serially connected between the negative bus and ground. These two resistors comprise a voltage divider with the junction between the two resistors being connected to the base of the transistor 16. A smoothing or filter capacitor 28 is also connected between the negative bus 22 and ground.

The collector of the transistor 16 is directly connected to the base of a transistor 30. The collector of the transistor 30 is connected through a load resistor 32 to ground. The emitter is connected through a resistor 34 to the negative bus 22. Connected in parallel with the resistor 34 is a series connected resistor 36 and a capacitor 38. The collector of the transistor 30 is connected to the base of an output transistor 40 through a coupling resistor 42. The collector of the transistor 40 is connected directly to the negative bus. The emitter of the transistor 40 is connected through a load resistor 44 to ground. The emitter of the transistor 40 is also connected through a coupling resistor 46 to an output terminal 48.

In operation, signals recorded on a magnetic tape record (not shown) are detected by the transducer 2 and applied as input signal to the base electrode of the transistor 4. As was mentioned hereinbefore, in order to improve the signal to noise ratio of signals of a frequency in the low to medium range, for example, up to about 500 KHz, it is desirable to provide a relatively high bias current through the transistor 4. That bias current is supplied from the positive voltage supply terminal through the resistor 8 and the choke 6 to the emitter of the transistor 4. A characteristic of the transistor is that there is an inherent internal resistive impedance and shunt capacitance. The internal resistive impedance is inversely proportional to the bias current while the capacitance is directly proportional to the bias current. The resistor 8 is relatively large compared to the input impedance of the transistor 4. Consequently, the d.c. bias applied to the transistor 4 is substantially a constant current. For the relatively low to middle range of frequencies, the choke 6 provides a very small impedance. Accordingly, the first stage of amplification is effectively connected, at the lower frequency range, in a common emitter mode and satisfies the requirements of providing a minimum internal resistance as well as an adequately high impedance to the input signal thereby satisfying the requirements for a relatively high signal-to-noise ratio transfer characteristic. The output of the transistor 4 is applied to the emitter of the transistor 16. The amplification or gain for these lower frequency signals is determined by the ratio of the value of the resistor 20 and the effective internal resistance of the transistor 4. The output signal from the transistor 16 is applied as input signal to the next amplifier stage transistor 30 the output of which is coupled to the buffer output transistor amplifier 40.

With respect to input signals of a higher frequency (for example, those lying between 500 KHz and 2 MHz) several deleterious effects would be manifested by such high current and resulting low input impedance and high capacitance of the first stage transistor. At the higher frequencies, the transducer 2, itself being an inductive device, presents a much higher source impedance. Consequently, the relatively low input impedance of a first stage amplifier would present an intolerable impedance mismatch, excessively loading the transducer 2. Additionally, the effective input capacitance of the first transistor stage 4 is increased by the higher current. At the lower frequencies, such internal capacitance was of little to no significance. At higher frequencies, however, that capacitance tends to resonate with the inductance of the transducer 2. As the effective capacitance of the first transistor increases, the resonant frequency of the transducer circuit falls well within the desired pass band of the system and the impedance of the transducer increases. Additionally, as previously mentioned, the higher input capacitance causes a significant increase in the effective impedance of the transducer. As the noise current of the input stage flows through the increased transducer impedance, a further noise signal ($I_n Z$) is produced. The present circuit obviates these deficiencies.

As the frequency of the input signal increases beyond the range of the medium band signals (beyond, for example, 500 KHz) the inductive impedance of the choke 6 also increases, constituting a degenerative feedback relationship which causes the input amplifier stage to respond effectively as an emitter follower. The damping resistor 10 is provided essentially for the purpose of avoiding spurious oscillation and limiting the impedance of the choke 6. While the choke 6 and the resistor 10 are illustrated as being separate and distinct items, there are available certain ferrite type inductors which include an inherent resistance sufficient to provide the desired properties here referred to. The increase in the inductive impedance of the choke 6 in the emitter circuit of the transistor 4 maintains, via degenerative feedback, a proper impedance relationship with the head 2 thereby avoiding the deterioration of the signal transfer due to loading.

As noted above, the inherent capacitance in the first stage transistor 4 tends to resonate with the inductance of the transducer. If that first stage transistor exhibits a voltage gain, the inherent, or Miller, capacitance is also multiplied by the gain factor of the transistor. Such multiplication of the Miller capacitance would, indeed, cause the resonant point of the transducer to be well within the desired pass band range. With the transistor 4 connected in cascode relationship with the transistor 16, the effective voltage gain of the first stage transistor is substantially zero. The arrangement of the cascode connection, together with the degenerative feedback which increases with frequency, progressively reduces the internal capacitance of the first stage, progressively forcing the resonant point of that capacitance with the inductance of the head to a frequency well beyond the desired pass band range, thus avoiding the disruptive influences of having the resonant point within the desired pass band range.

Inasmuch as the choke 6 in the emitter circuit of the transistor 4 exercises a frequency responsive degenerative feedback, there is a corresponding decrease in the effective gain of the combination of transistors 4 and 16 at the frequency at which the choke becomes effective. This is illustrated in curve A of FIG. 2. The gain of the cascode connection of transistors 4 and 16 is relatively flat up to the frequency at which the choke 6 begins to become effective. In the illustrative embodiment, that frequency may be 500 KHz. At that frequency, the degenerative action of the choke causes the gain to fall off with frequency. The decrease in gain is, of course, an undesirable characteristic, if not compensated. In accordance with the present invention, compensation for such decrease in gain is accomplished in the amplification characteristics of the third stage including the transistor 30.

Figure 2:
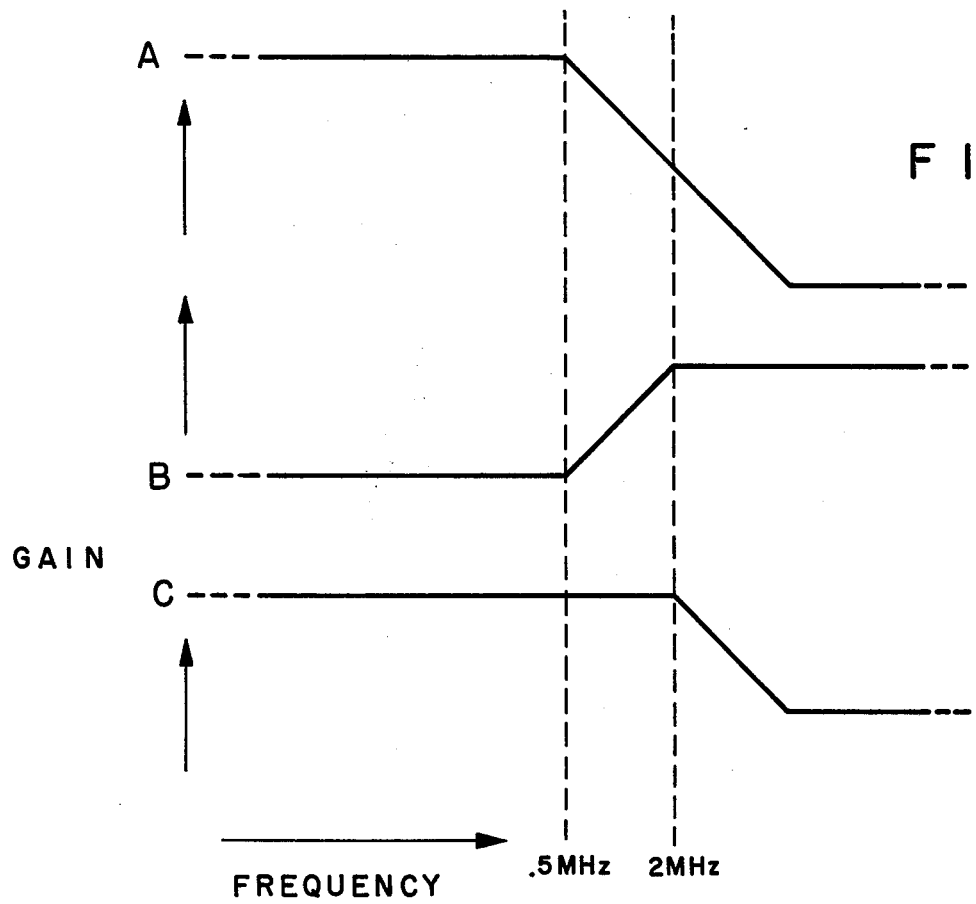
FIG. 2 is a set of curves representative of relationships within the circuit illustrated in FIG. 1 and useful in the understanding thereof.

It will be recalled that in the emitter circuit of the transistor 30, there is the series connection of the resistor 36 and a capacitor 38 connected in parallel with the resistor 34. At the lower frequency end of the signal range, the capacitor 38 presents a relatively high impedance, permitting the resistor 34 to determine the gain for the transistor 30. When, however, the signal frequency reaches the desired break point, the impedance of the capacitor diminishes proportionately to the increase in frequency. That reduction in emitter impedance produces a corresponding increase in the gain of the amplifier stage, compensating for the decrease in gain from the previous stage in the upper frequency band. The resistor 36 in series with the capacitor 38 is effectively a limiting resistor dimensioned to determine the upper frequency limit beyond which the capacitor becomes ineffective to change the gain of the amplifier stage 30. In the illustrative embodiment, that limit is chosen to fall at the upper limit of the desired pass band, for example, at 2 MHz. The gain characteristic of the third stage is illustrated in curve B of FIG. 2. Curve C of FIG. 2 illustrates the net effect of the gain characteristics illustrated in curves A and B of FIG. 2. Thus, at the output of the transistor stage 30, the net gain characteristic for the circuits up to that point is relatively flat out to the limit of the desired pass band, illustratively 2 MHz. Since the degenerative effect of the choke 6 continues on beyond the 2 MHz limit, the net gain diminishes after the 2 MHz limit has been exceeded. This, however, does not adversely affect the operation of the circuit in the desired pass band but, indeed, acts as a low pass filter to reduce out-of-band noise.

A further desirable advantage results from the structure set forth in that if there should be any residual line frequency ripple or other noise disturbance on the negative power supply bus 22, that noise or ripple would be nulled in the transistor 30 since both the emitter and the base electrodes are referenced to that bus 22. Accordingly, the transistor would tend to float with the ripple or noise on the line 22.

Figure 3:
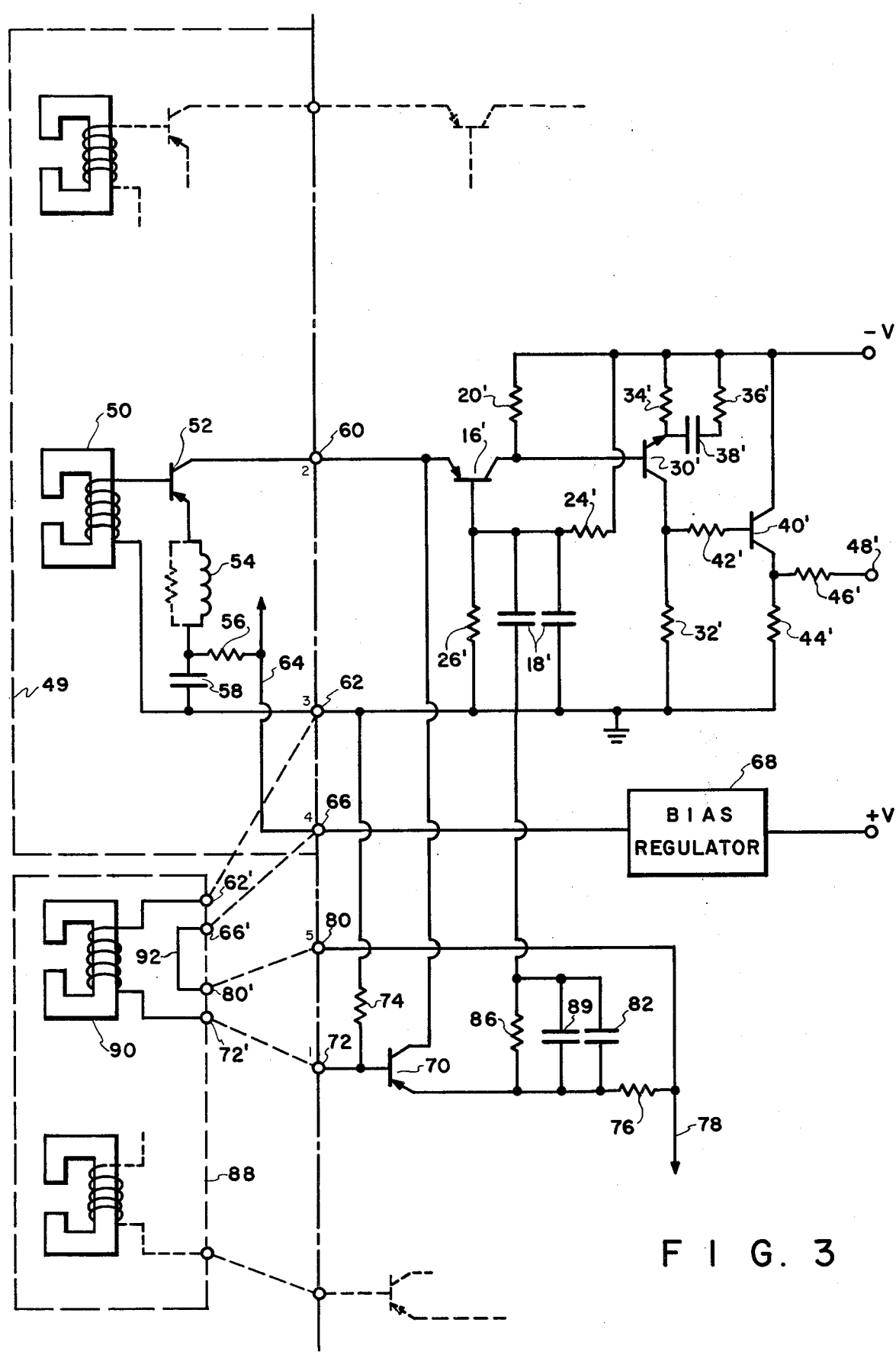
FIG. 3 is a schematic diagram of a special arrangement embodying the present invention.

In FIG. 3 there is illustrated a special application of the present invention as hereinbefore described. It was suggested in connection with the discussion of the circuit shown in FIG. 1 that transducers and the associated circuitry are frequently used in a multi-track, multi-head configuration.

Further, with regard to the wide band transducer, it has been found that it is highly desirable to have the first stage amplifier physically as near as possible to the transducer itself in order to minimize crosstalk and transducer impedance. Accordingly, in FIG. 3, there is shown an amplifier arrangement wherein the main body of the amplifier itself is mounted in the instrument chassis and is arranged to accommodate plug-in type head or transducer units. A wide band tape transducer 50 is included in a module which also includes an input transistor 52, a choke 54, a constant current resistor 56 and a filter capacitor 58. As previously mentioned, the choke is preferably of the ferrite type which exhibits sufficient internal resistance to accomplish the desired damping and minimum size. The several elements are connected together in the same manner as the corresponding elements of FIG. 1 with the following exceptions. The collector of the transistor 52 is connected to a first plug-in terminal 60. The opposite end of the winding of the transducer 50 is connected to a second plug-in terminal 62 which is, in turn, connected to ground. The wide band module also includes a lead 64 which connects the remote end of the resistor 50 to a third plug-in terminal 66.

As was previously mentioned, it is anticipated that structure of the type herein shown and described is included in a multi-track, multi-transducer configuration wherein a plurality of independent transducers are positioned side by side to operate in conjunction with corresponding tracks on the multi-track record member. In that configuration, the plurality of transducers and amplifiers are all mounted in a module which may be plugged into a corresponding chassis for connection to the associated amplifiers as set forth herein. In such a configuration, the lead 64 comprises a common bus connected at one end through the terminal 66 to the output of a power regulator 68 whereby to apply the positive source voltage to the corresponding resistor 56 of all of the wide band transducer circuits. In the chassis side of the assembly shown in FIG. 3, the plug-in terminal is connected to the emitter of the second stage, grounded base, transistor 16'. The transistor 16' responds in all respects to the transistor 16 illustrated and discussed in FIG. 1 as do the other elements of the circuit of FIG. 3 which bear primed reference numerals corresponding to the similar elements of FIG. 1. Inasmuch as the voltage at the emitter of the transistor 16' is substantially at ground potential with respect to the applied signal, it is particularly convenient to provide the plug-in relation with respect to the first stage transistor 52 at that point. The ground potential at the plug-in junction reduces the susceptibility of that junction to the influence of stray radiation or crosstalk signals.

Initially, however, there is provided a first stage amplifier transistor 70 which has the base electrode thereof connected to a fourth plug-in terminal 72. The base electrode is also connected through a resistor 74 to the ground bus terminal 62. The emitter of the transistor 70 is connected through a resistor 76 to a common bus 78 which is, in turn, connected to a fifth plug-in terminal 80. The collector of the transistor 70 is connected to the emitter of the transistor 16'. Suitable filtering is provided by the capacitors 82 and 84 as well as the resistor 86 connected between the emitter of the transistor 70 and the ground bus.

Some users of equipment of the type herein described do not need the wide frequency band response characteristic. Their need is only to the medium band response characteristic. Such medium band response characteristic also does not require (1) that the first amplifier stage be in close juxtaposition with regard to the transducer and (2) the high frequency feedback choke circuitry in connection with the input amplifier stage. For such users, there is provided a second type of transducer module 88 for use in the low to medium frequency band range. That module 88 includes one or more transducers 90 of the type suitable for use in the medium band range. The transducer 90 has one end of the winding connected to a plug-in terminal 62'. The other end of the winding of the transducer 90 is connected to a second plug-in terminal 72'. Also provided within the module 88 is an enabling jumper 92 having a first end connected to a plug-in terminal 66' and a second end connected to a plug-in terminal 80'. If as mentioned, the user had need only for the medium frequency band response characteristic, a transducer module 88 would be plugged in to the plug-in terminals of the amplifier chassis rather than the wide band module 49.

Since, because of the space requirements, the wide band module had the first stage of the amplifier in the module itself, and as such first stage amplifier is not included in the medium band module 88, the amplifier transistor 70 comprises such a first stage for the transducer 90 of the medium band module. Whereas on the amplifier chassis there are provided five input terminals, as hereinbefore noted, only the first three, terminals 60, 62 and 66 are used by the wide band module. If that module includes a plurality of transducers, the terminals 60 and 62 would be repeated for each of the additional transducers, the terminal 66 being common to all of the transducer input circuits via the bus 64.

On the other hand, if the medium band transducer module is to be used with the amplifier chassis, the first input terminal 60 of the amplifier chassis is not used. The medium band module is arranged to plug-in to the other four terminals, namely, terminal 62, 66, 72 and 80. Thus, with the wide band module having a built in first stage amplifier, the output terminals of that module are arranged to be connected directly to the second stage amplifier 16'. When, however, the medium band module is to be used with the amplifier, the output terminal of the transducer 90 is arranged to be connected to the input terminal of the first stage amplifier 70. Both of the modules are arranged to utilize the grounded input plug-in terminal 62.

It will be noted that when the wide band module is used with the amplifier chassis, the bias signal from the bias regulator 68 connected to the plug-in terminal 66, is connected to supply bias current to the input stage amplifier 52 within the structure of the transducer module; the transistor amplifier stage 70 being disconnected from the bias supply during that time. When the medium band transducer module 88 is plugged into the amplifier chassis, the jumper 92 connects the output of the bias regulator 68 to supply bias current to the transistor 70 thereby energizing that transistor to serve as the input stage for the transducer 90. In order to avoid confusion as between the connections for the two different types of transducer modules, the plug-in terminals of the amplifier chassis are spatially arranged in a unique pattern to correspond with the spatial arrangement of the properly related terminals of the two distinct modules. Thus, the proper connections will automatically be made when one or the other of the module is plugged in to the amplifier chassis.

Thus, there has been provided, in accordance with the present invention, an improved pre-amplifier for magnetic transducer systems which features improved signal to noise response characteristics over a wide frequency range of input signal, which reduces the probability of crosstalk between neighboring channels and which is relatively simple in construction and operation.

The embodiments of the invention in which an exclusive property or privilege is claimed are defined as follows:

1. A magnetic record reproducing system comprising
a magnetic record reproducing transducer having an inductive impedance which increases with increases in signal frequency;
a transistor amplifier connected to be responsive to signals from said transducer, said amplifier including a first stage transistor connected in common emitter mode with said transducer connected across the base-emitter path of said transistor;
bias means connected to the emitter circuit of said first stage transistor for supplying a controlled bias current for said first stage transistor amplifier to establish a low internal resistance in said transistor; and
an impedance means the impedance of which increases with an increase in frequency of applied input signals above a predetermined threshold frequency;
said impedance means being connected in the emitter circuit of said transistor between the emitter of said transistor and said bias means whereby to maintain the input impedance of said transistor amplifier at a lever higher than the impedance of said transducer.

2. A magnetic record reproducing system as set forth in claim 1 wherein said impedance means is an inductive impedance member.

3. A magnetic record reproducing system comprising
a magnetic record reproducing transducer having an inductive impedance which increases with increases in signal frequency;
a transistor amplifier connected to be responsive to signals from said transducer, said amplifier including a first stage transistor connected in a common emitter mode with said transducer connected across the base emitter path of said transistor, said amplifier further including means for limiting the voltage gain of said transistor to substantially zero gain;
bias means connected to the emitter circuit of said first stage transistor for supplying a controlled bias current for said first stage transistor amplifier to establish a low internal resistance in said transistor; and
a variable impedance means the impedance of which increases with an increase in frequency of applied input signals above a predetermined threshold frequency, said variable impedance means being connected in the emitter circuit of said transistor between the emitter of said transistor and said bias means whereby to maintain the input impedance of said transistor amplifier at a level higher than the impedance of said transducer.

4. A magnetic record reproducing system comprising
a magnetic record reproducing transducer having an inductive impedance which increases with increases in signal frequency;
a transistor amplifier connected to be responsive to signals from said transducer, said amplifier including a first stage transistor connected in a common emitter mode with said transducer connected across the base emitter path of said transistor, said amplifier further including means including a second stage transistor connected in cascode relation with said first stage transistor for limiting the voltage gain of said first stage transistor to substantially zero gain;
bias means connected to the emitter circuit of said first stage transistor for supplying a controlled bias current for said first stage transistor amplifier to establish a low internal resistance in said first stage transistor; and
a variable impedance means the impedance of which increases with an increase in frequency of applied input signals above a predetermined threshold frequency, said variable impedance means being connected in the emitter circuit of said first stage transistor between the emitter of said first stage transistor and said bias means whereby to maintain an impedance level of the input impedance of said first stage transistor which is at least equal to the impedance of said transducer.

5. A magnetic record reproducing system comprising
a magnetic record reproducing transducer having an inductive impedance which increases with increases in signal frequency;
a transistor amplifier connected to be responsive to signals from said transducer, said amplifier including a first stage transistor connected in a common emitter mode with said transducer connected across the base emitter path of said transistor, said amplifier further including means including a second stage transistor connected in cascode relation with said first stage transistor limiting the voltage gain of said transistor to substantially zero gain;
bias means connected to the emitter circuit of said first stage transistor for supplying a controlled bias current for said first stage transistor amplifier to establish a low internal resistance in said first stage transistor;
a variable impedance means the impedance of which increases with an increase in frequency of applied input signals above a predetermined threshold frequency, said variable impedance means being connected in the emitter circuit of said transistor between the emitter of said first stage transistor and said bias means whereby to maintain an impedance level of the input impedance of said transistor at lease as high as the impedance of said transducer; and a third stage transistor amplifier connected to the output of said second stage transistor amplifier, said third stage transistor amplifier including compensating means for providing a frequency responsive gain boost to compensate for frequency responsive gain decrease occasioned by said variable impedance means in the emitter circuit of said first stage transistor.

6. A magnetic record reproducing system as set forth in claim 5 wherein said compensating means comprises a capacitive impedance element connected in the emitter circuit of said third stage transistor amplifier whereby to provide a frequency responsive reduction in emitter impedance between predetermined frequency limits.

7. A magnetic record reproducing system comprising a magnetic record transducer having a signal winding for generating input signals in accordance with recorder intelligence signals;

a first stage transistor amplifier connected in the common emitter mode, said signal winding being connected across the base emitter circuit of said transistor amplifier;

bias means connected to the emitter circuit of said first stage transistor for supplying a controlled bias current for said first stage transistor amplifier whereby to establish a low internal resistance in said transistor;

frequency responsive impedance means connected in the emitter circuit of said first stage transistor between the emitter of said first stage transistor and said bias means, said frequency responsive impedance means being responsive to frequencies greater than a predetermined threshold frequency to effectively increase the input impedances of said first stage amplifier with corresponding increases in input signal frequencies applied thereto, said increase in input impedance being also operative to reduce the effective internal capacitance of said first stage transistor; and a second stage transistor amplifier connected to said first stage amplifier in cascade relationship whereby to provide a substantially zero voltage gain at the output of said first stage amplifier minimizing crosstalk pick-up of said first stage amplifier.

8. A magnetic record reproducing system comprising a magnetic record transducer having a signal winding for generating input signals in accordance with recorded intelligence signals;

a first stage transistor amplifier connected in the common emitter mode, said signal winding being connected across the base emitter circuit of said transistor amplifier;

bias means connected to the emitter circuit of said first stage transistor for supplying a controlled bias current for said first stage transistor amplifier, whereby to establish a low internal resistance in said transistor;

frequency responsive impedance means connected in the emitter circuit of said first stage transistor between the emitter of said first stage transistor and said bias means, said frequency responsive impedance means being responsive to frequencies greater than a predetermined threshold frequency to effectively increase the input impedances of said first stage amplifier with corresponding increases in input impedance being also operative to reduce the effective internal capacitances of said first stage transistor;

a second stage transistor amplifier connected to said first stage amplifier in cascade relationship whereby to provide a substantially zero voltage gain at the output of said first stage amplifier minimizing crosstalk pick-up of said first stage amplifier; and a third stage transistor amplifier connected to the output of said second stage transistor amplifier, said third stage transistor including a frequency responsive variable gain control means responsive to increases in the frequency of input signals between predetermined frequency limits to increase the gain of said third stage amplifier to compensate for corresponding decreases in gain in said first stage amplifier due to the operation of said frequency responsive impedance means in said first stage amplifier.

9. A magnetic record reproducing system comprising a magnetic record transducer having a signal winding for generating input signals in accordance with recorder intelligence signals;

a first stage transistor amplifier connected in the common emitter mode, said signal winding being connected across the base emitter circuit of said transistor amplifier;

bias means connected to the emitter circuit of said first stage transistor for supplying a controlled bias current for said first stage transistor amplifier, whereby to establish a low internal resistance in said transistor;

frequency responsive impedance means connected in the emitter circuit of said first stage transistor between the emitter of said first stage transistor and said bias means, said frequency responsive impedance means being responsive to frequencies greater than a predetermined threshold frequency to effectively increase the input impedances of said first stage amplifier with corresponding increases in input signal frequencies applied thereto, said increase in input impedance being also operative to reduce the effective internal capacitance of said first stage transistor; and a second stage transistor amplifier connected to said first stage amplifier in cascode relationship whereby to provide a substantially zero voltage gain at the output of said first stage amplifier minimizing crosstalk pick-up of said first stage amplifier; and a third stage transistor amplifier connected to the output of said second stage transistor amplifier, said third stage transistor including a frequency responsive variable gain control means responsive to increases in the frequency of input signals between predetermined frequency limits to increase the gain of said third stage amplifier to compensate for corresponding decreases in gain in said first stage amplifier due to the operation of said frequency responsive impedance means in said first stage amplifier, said gain control means comprising a capacitive impedance means connected in the emitter circuit of said third stage transistor.

10. A magnetic record reproducing system comprising amplifier means arranged for use with either of two input plug-in transducer modules said amplifier including a first stage transistor connected in a common emitter configuration, a second stage transistor connected in a common base mode, means connecting an output of said first stage transistor to an input of said second stage transistor in cascode relation;

said amplifier having a plurality of plug-in terminals, a first one of said terminals being connected to an input of said first stage transistor, a second one of said terminals being connected to said input of said second stage transistor, a third one of said terminals being connected to a common point of reference potential, a fourth one of said terminals being connected to a source of bias current, and a fifth one of said terminals being connected to a bias current bus for said first stage transistor;

a first of said transducer modules including at least a magnetic record transducer having a signal winding and a bias current jumper, said signal winding being connected to terminals positionally arranged to engage, respectively, said first and third amplifier plug-in terminals, said jumper being connected to terminals positionally arranged to engage, respectively, said fourth and fifth amplifier plug-in terminals;

a second of said transducer modules including at least a magnetic record transducer having a signal winding, a first stage transistor amplifier connected in a common emitter mode, said winding having a first connection to a base input of said transistor, a frequency responsive impedance means connected in the emitter circuit of said transistor, said frequency responsive impedance means being responsive to frequencies greater than a predetermined threshold frequency to effectively increase the input impedances of said first stage transistor with corresponding increases in input signal frequencies to maintain an impedance level of said first stage transistor which is at least as high as the impedance of said transducer, and a bias current bus for said first stage transistor, said first stage transistor having an output connected to a terminal positionally arranged to engage said second plug-in terminal of said amplifier, said winding having a second connection to a terminal positionally arranged to engage said third plug-in terminal of said amplifier, said bias current bus being connected to a terminal positionally arranged to engage said fourth plug-in terminal of said amplifier;

said positional arrangement of said plug-in terminals and the correlated terminals of said first and second transducer modules being such that with said first module, the transducer is connected to said first stage transistor of said amplifier, said first stage being energized by said jumper, and with said second transducer module said first stage transistor of said amplifier is energized, said first stage transistor of said second module being connected to said second stage transistor of said amplifier in cascode relation.

11. A magnetic record reproducing system as set forth in claim 10 wherein said amplifier includes a plurality of amplification channels, each having corresponding positionally arranged input plug-in terminals and said transducer modules include a corresponding plurality of transducer elements.

12. A magnetic record reproducing system as set forth in claim 10 wherein said amplifier includes a third stage transistor having an input connected to the output of said second stage transistor, said third stage including frequency responsive gain control means to provide a gain boost for signal frequencies between predetermined limits whereby to compensate for a corresponding gain loss occasioned by the frequency responsive impedance variation of the first stage transistor circuit of said second module.

* * * * *